(12) United States Patent
Dalton et al.

(10) Patent No.: US 8,791,545 B2
(45) Date of Patent: Jul. 29, 2014

(54) INTERCONNECT STRUCTURES AND DESIGN STRUCTURES FOR A RADIOFREQUENCY INTEGRATED CIRCUIT

(75) Inventors: Timothy J. Dalton, Ridgefield, CT (US); Ebenezer E. Eshun, Newburgh, NY (US); Sarah L. Grunow, Poughkeepsie, NY (US); Zhong-Xiang He, Essex Junction, VT (US); Anthony K. Stamper, Williston, VT (US)

(73) Assignee: International Business Machines Corporation, Armonk, NY (US)

( * ) Notice: Subject to any disclaimer, the term of this patent is extended or adjusted under 35 U.S.C. 154(b) by 41 days.

(21) Appl. No.: 13/560,446

(22) Filed: Jul. 27, 2012

(65) Prior Publication Data
US 2012/0292741 A1 Nov. 22, 2012

Related U.S. Application Data

(62) Division of application No. 12/634,742, filed on Dec. 10, 2009, now Pat. No. 8,298,902.

(60) Provisional application No. 61/161,108, filed on Mar. 18, 2009.

(51) Int. Cl.
*H01L 21/02* (2006.01)

(52) U.S. Cl.
USPC ............................ 257/532; 257/528; 257/724

(58) Field of Classification Search
USPC .................................................. 257/528, 724
See application file for complete search history.

(56) References Cited

U.S. PATENT DOCUMENTS

| | | | |
|---|---|---|---|
| 4,639,760 A | 1/1987 | Granberg et al. |
| 4,682,414 A | 7/1987 | Butt |
| 6,420,254 B1 | 7/2002 | Stamper et al. |
| 6,461,914 B1 | 10/2002 | Roberts et al. |
| 6,580,137 B2 | 6/2003 | Parke |
| 6,734,053 B2 | 5/2004 | Liu et al. |
| 6,876,028 B1 | 4/2005 | Coolbaugh et al. |
| 6,995,070 B2 | 2/2006 | Seo |
| 7,078,785 B2 | 7/2006 | Ciancio et al. |
| 7,112,504 B2 | 9/2006 | Hsin et al. |
| 7,118,985 B2 | 10/2006 | Allman et al. |
| 7,129,534 B2 | 10/2006 | Tuttle |
| 7,199,001 B2 | 4/2007 | Wu et al. |
| 7,282,404 B2 | 10/2007 | Coolbaugh et al. |

(Continued)

OTHER PUBLICATIONS

USPTO, Notice of Allowance issued in related U.S. Appl. No. 12/634,742 dated Jul. 10, 2012.

(Continued)

*Primary Examiner* — Daniel Whalen
(74) *Attorney, Agent, or Firm* — Wood, Herron & Evans LLP; Anthony J. Canale

(57) ABSTRACT

Interconnect structures that include a passive element, such as a thin film resistor or a metal-insulator-metal (MIM) capacitor, methods for fabricating an interconnect structure that includes a passive element, and design structures embodied in a machine readable medium for designing, manufacturing, or testing an integrated circuit, such as a radiofrequency integrated circuit. A top surface of a dielectric layer is recessed relative to a top surface of a conductive feature in the dielectric layer. The passive element is formed on the recessed top surface of the dielectric layer and includes a layer of a conductive material that is coplanar with, or below, the top surface of the conductive feature.

12 Claims, 11 Drawing Sheets

(56) References Cited

U.S. PATENT DOCUMENTS

| | | | |
|---|---|---|---|
| 7,282,757 B2 | 10/2007 | Tu et al. | |
| 7,332,764 B2 | 2/2008 | Choi et al. | |
| 2004/0175883 A1* | 9/2004 | Kim | 438/244 |
| 2006/0258111 A1 | 11/2006 | Jagueneau et al. | |
| 2007/0158717 A1 | 7/2007 | Edelstein et al. | |
| 2008/0171442 A1 | 7/2008 | Wu et al. | |

OTHER PUBLICATIONS

USPTO, Office Action issued in related U.S. Appl. No. 12/634,742 dated Feb. 29, 2012.

USPTO, Office Action issued in related U.S. Appl. No. 12/634,742 dated Oct. 14, 2011.

USPTO, Office Action issued in related U.S. Appl. No. 12/634,742 dated Jun. 7, 2011.

* cited by examiner

US 8,791,545 B2

1

INTERCONNECT STRUCTURES AND DESIGN STRUCTURES FOR A RADIOFREQUENCY INTEGRATED CIRCUIT

CROSS-REFERENCE TO RELATED APPLICATIONS

This application is a divisional of application Ser. No. 12/634,742, filed Dec. 10, 2009, which claims the benefit of U.S. Provisional Application No. 61/161,108, filed Mar. 18, 2009. The disclosure of each of these patent documents is incorporated by reference herein in its entirety.

BACKGROUND

The invention relates generally to semiconductor device fabrication and, in particular, to methods for fabricating a back-end-of-line (BEOL) interconnect structure that includes an on-chip passive element, BEOL interconnect structures that include a passive element and design structures for a radiofrequency integrated circuit (RFIC).

On-chip passive elements, such as thin film resistors and metal-insulator-metal (MIM) capacitors, are deployed in many types of integrated circuits, such RFICs. MIM capacitors and thin film resistors are integrated into one of the dielectric layers in a metallization level of the BEOL interconnect structure using the BEOL metallurgy. BEOL interconnect structures are routinely fabricated by damascene processes. For example, dual damascene process etch vias and trenches in a dielectric layer using reactive ion etching (RIE), which are concurrently filled with a conductor using a single blanket deposition and planarized. This process step is replicated to stack different metallization and via levels to create a multi-level, high density framework of metal interconnections.

During the fabrication of a metallization level, a thin film resistor is formed by depositing and patterning a conductive material with a relatively high resistance to a desired size and geometrical shape. Similarly, a MIM capacitor may be formed that includes a stacked structure consisting of plates of a conductor, which operate as electrodes, and an interplate dielectric layer situated between the plates.

Improved methods are needed for fabricating BEOL interconnect structures that include on-chip passive elements, as well as improved BEOL interconnect structures that integrate passive elements and RFIC design structures.

BRIEF SUMMARY

Generally, methods are provided for fabricating back-end-of-line (BEOL) interconnect structures and BEOL interconnect structures are provided that include an on-chip passive element, such as a thin film resistor or a metal-insulator-metal (MIM) capacitor.

In an embodiment, a back-end-of-line (BEOL) interconnect structure includes a metallization level having a dielectric layer with a top surface and a first conductive feature in the dielectric layer. The first conductive feature has a top surface that projects above at least a portion of the top surface of the first dielectric layer. A passive element, which is located on the top surface of the dielectric layer, includes a layer of a conductive material having a top surface that is approximately coplanar with the top surface of the first conductive feature or below the top surface of the first conductive feature.

In another embodiment, the BEOL interconnect structure is included in a design structure, which is embodied in a machine readable medium for designing, manufacturing, or testing an integrated circuit. The design structure may comprise a netlist. The design structure may also reside on storage medium as a data format used for the exchange of layout data of integrated circuits. The design structure may reside in a programmable gate array.

In another embodiment, a method for fabricating a BEOL interconnect structure includes forming a first conductive feature extending through a dielectric layer of a metallization level of the BEOL interconnect structure and recessing a top surface of the dielectric layer relative to a top surface of the first conductive feature. After the top surface of the dielectric layer is recessed, a passive element is formed on the top surface of the dielectric layer. The passive element has a layer of a conductive material with a top surface that is approximately coplanar with the top surface of the first conductive feature or below the top surface of the first conductive feature.

In another embodiment, a method for fabricating a BEOL interconnect structure includes forming a first conductive feature extending through a layer stack of first and second dielectric layers in a metallization level and removing the first dielectric layer from the second dielectric layer to expose a top surface of the second dielectric layer so that the top surface of the second dielectric layer has a recessed relationship relative to a top surface of the first conductive feature. After the first dielectric layer is removed, a passive element is formed on the top surface of the second dielectric layer. The passive element has a layer of a conductive material with a top surface that is approximately coplanar with the top surface of the first conductive feature or below the top surface of the first conductive feature.

BRIEF DESCRIPTION OF THE SEVERAL VIEWS OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention.

DETAILED DESCRIPTION

Figure 1:
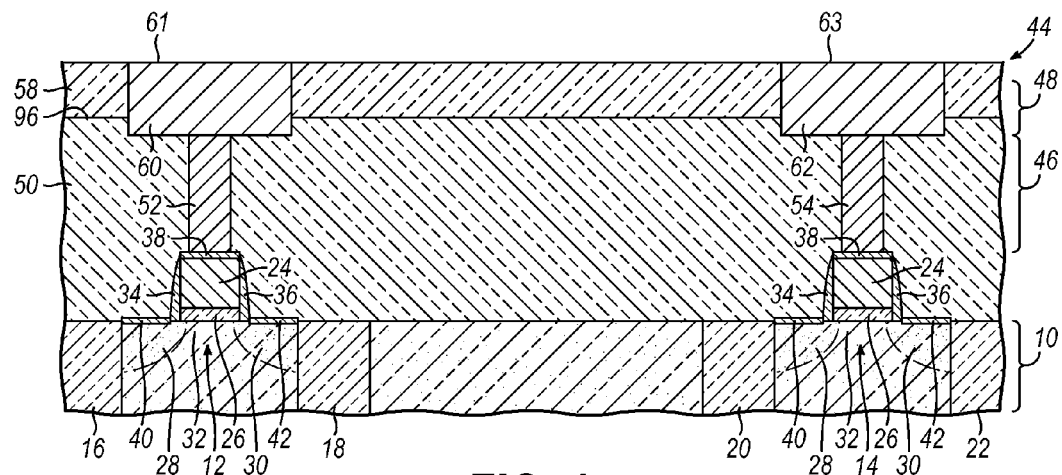
FIG. 1 is a diagrammatic cross-sectional view of a portion of a BEOL interconnect structure at an initial fabrication stage of a processing method in accordance with an embodiment of the invention.

With reference to FIG. 1 and in accordance with an embodiment of the invention, a substrate 10 includes device structures, such as the representative device structures 12, 14, fabricated by front-end-of-line (FEOL) processes. In one embodiment, the device structures 12, 14 may be associated with a radiofrequency integrated circuit (RFIC). Circuit designs for such RFICs are understood by a person having ordinary skill in the art. The substrate 10 may be a wafer composed of a semiconductor material including, but not limited to, silicon (Si), silicon germanium (SiGe), a silicon-on-insulator (SOI) layer, and other like silicon-containing semiconductor materials that a person having ordinary skill in the art would recognize as suitable for use in fabricating an integrated circuit. For example, substrate 10 may be composed of a monocrystalline silicon-containing material, such as single crystal silicon.

Shallow trench isolation regions, of which shallow trench isolation regions 16, 18, 20, 22 are representative, are formed using standard techniques in a substrate 10. The shallow trench isolation regions 16, 18, 20, 22 are composed of a dielectric material, such as silicon dioxide ($SiO_2$). For example, trenches may be defined in substrate 10 using standard lithography and anisotropic dry etching, filled with amounts of the dielectric material, and planarized by a conventional chemical mechanical polishing (CMP) process. Shallow trench isolation regions 16, 18 and shallow trench isolation regions 20, 22 connect to define and peripherally encircle device regions of the substrate 10 containing the device structures 12, 14 and provide electrical isolation.

Each of the device structures 12, 14, which are representatively illustrated as field effect transistors, includes a gate electrode 24, a gate dielectric layer 26, and heavily doped source/drain diffusions or regions 28, 30 formed in the semiconductor material of the substrate 10. Contingent upon the specific device type, source/drain region 28 may act as a drain and source/drain region 30 may act as a source, or the converse associations may apply. The source/drain regions 28, 30 are separated by a channel region 32 also defined in the semiconductor material of the substrate and located directly beneath the gate electrode 24 and gate dielectric layer 26. The semiconductor material constituting the channel region 32 of each of the device structures 12, 14 is lightly doped to have a conductivity type opposite to the conductivity type of the semiconductor material contained in the source/drain regions 28, 30. Spacers 34, 36 composed of a dielectric material, such silicon nitride ($Si_3N_4$), are formed on the sidewalls of each gate electrode 24. Silicide layers 38, 40, 42 are formed on the top surfaces of each gate electrode 24 and each set of source/drain regions 28, 30, respectively.

The gate electrode 24 and gate dielectric layer 26 are formed by conventional methods understood by a person having ordinary skill in the art. The gate electrode 24 is composed of a conductor, such as a metal, doped polysilicon, a metal silicide, or a layered stack of these conductive materials, and is characterized by a significantly higher electrical conductivity than the gate dielectric layer 26. The gate dielectric layer 26 may be composed of any suitable dielectric or insulating material including, but not limited to, $SiO_2$, silicon nitride ($SiN_x$), silicon oxynitride ($SiO_xN_y$), a high-k dielectric like hafnium oxide ($HfO_2$), hafnium oxynitride (HfSiON), or zirconium oxide ($ZrO_2$), or layered stacks of these and other dielectric materials. The source/drain regions 28, 30 are formed in a self-aligned manner by implantation or diffusion of a suitable conductivity type dopant, such as arsenic (As) or phosphorous (P) for n-type conductivity or boron (B) for p-type conductivity, into the semiconductor material of the substrate 10.

A back-end-of-line (BEOL) interconnect structure, generally indicated by reference numeral 44, includes a local interconnect level or contact (CA) level 46 and a metallization (M1) level 48 that is separated from the device structures 12, 14 by the CA level 46. The CA level 46 includes a dielectric layer 50 and multiple contacts, such as the representative contacts 52, 54 that are electrically connected with the silicide layer 38 on the respective gate electrode 24 of the device structures 12, 14, that penetrate through the dielectric layer 50. A local interconnect (MC) level (not shown) may be present between the CA level 46 and the device structures 12, 14. Additional contacts (not shown) are formed in the dielectric layer 50 and are electrically connected with the silicide layers 40, 42 on each set of source/drain regions 28, 30.

Dielectric layer 50 of the CA level 46 is composed of an electrically-insulating dielectric material, such as borophosphosilicate glass (BPSG), phosphosilicate glass (PSG), diamond, or $SiO_2$, that has been deposited and planarized. The contacts 52, 54 are formed from a conductor, such as a refractory metal like tungsten (W), which can be lined with a conductor such as titanium nitride (TiN). Wires 60, 62 are composed of a conductor such as copper (Cu), aluminum (Al), alloys (e.g., AlCu) of primary metals, and other similar metals, which may be lined with a refractory metal, such as tantalum nitride (TaN) or TiN, as known to a person having ordinary skill in the art.

The M1 level 48 includes a dielectric layer 58, and wires 60, 62 of a conductor embedded in the dielectric layer 50 and dielectric layer 58, which is disposed on dielectric layer 50 after the CA contacts are formed. The wires 60, 62 are electrically coupled by the contacts 52, 54 with the gate electrode 24 of the respective device structures 12, 14. The dielectric layer 58 may be formed from any organic or inorganic dielectric material. For example, the dielectric layer 58 may be a thin film composed of porous or non-porous SiCOH, also known as organosilicate glass (OSG) or carbon doped oxide (CDO), deposited, for example, with a deposition recipe based on plasma enhanced chemical vapor deposition (PECVD) and having a relative dielectric constant of about 3.0 or less. As other examples, the dielectric layer 58 may be composed of a fluorosilicate glass (FSG), which has a relative dielectric constant of about 3.6, $SiO_2$, which has a relative dielectric constant of 3.9 to 4.3, or any other interlayer dielectric or porous interlayer dielectric as known to a person having ordinary skill in the art. The composition and properties of such inorganic low-k dielectric materials may vary contingent upon the selection of deposition conditions and source gases. The dielectric layer 58 may be composed of other low-k dielectric materials, such as or methyl silsesquioxane polymer (MSQ), or from materials like silicon oxycarbonitride (SiOCN), $SiN_x$, silicon carbonitride (SiCN), or silicon carbide (SiC).

Figure 2:
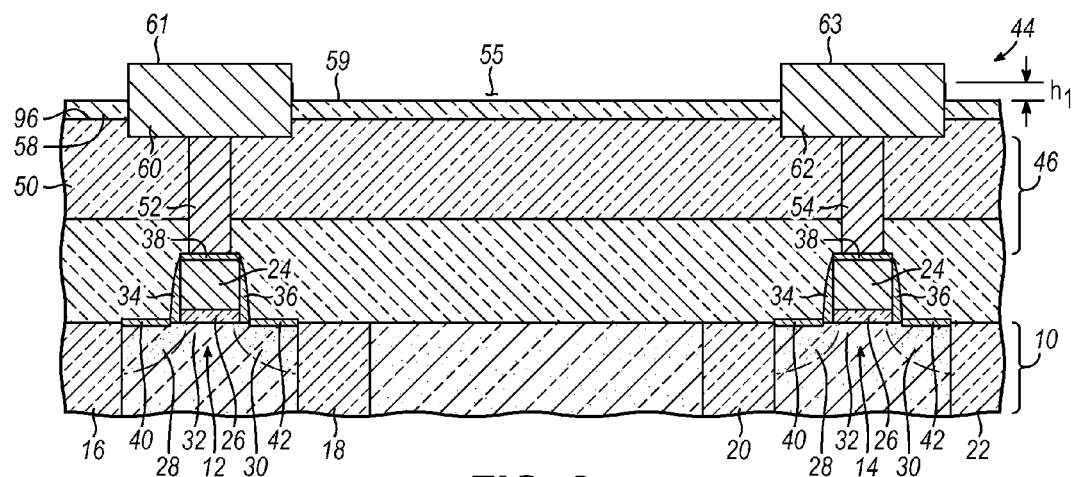
FIGS. 2-7 are diagrammatic cross-sectional views of the portion of the BEOL interconnect structure of FIG. 1 at a series of subsequent fabrication stages.

With reference to FIG. 2 in which like reference numerals refer to like features in FIG. 1 and at a subsequent fabrication stage, a top surface 59 of the dielectric layer 58 is recessed relative to a top surface 61 of wire 60 and a top surface 63 of wire 62 to define a recess 55. The top surfaces 61, 63 of the wires 60, 62 and the recessed top surface 59 of the dielectric layer 58 are contained in non-coplanar parallel planes separated by a height difference, $h_1$. The recessing of the top surface 59 of the dielectric layer 58, which is initially coplanar with the top surface 63 of the wire 62, is performed without any masking so that the entire top surface 59 is recessed. In one embodiment, the dielectric layer 58 is thinned from an initial thickness of about 150 nm to a final thickness of about 100 nm so that the top surfaces 61, 63 of the wires 60, 62 project about 50 nm above the recessed top surface 59 of the dielectric layer 58.

The recessing relative to the top surfaces 61, 63 of wires 60, 62 to form the recess 55 may be executed by various material removal techniques understood by a person having ordinary skill in the art. In one embodiment, an isotropic wet etchant is used that has a chemical composition effective to etch the dielectric material of the dielectric layer 58 at a significantly greater material removal rate than the conductor of the wires 60, 62.

In one specific embodiment of the invention, the dielectric layer 58 is composed of SiCOH, which may be damaged by oxygen plasma exposure and then wet etched with, for example, an aqueous dilution of hydrofluoric acid (DHF). The plasma exposure makes a damaged thickness of the dielectric material of the dielectric layer 58 highly susceptible to removal by wet chemical etching and permits control over the depth of the recess 55. The etchant selectively removes the dielectric material of the dielectric layer 58 relative to the conductor in wires 60, 62 such that the wires 60, 62 are relatively unaffected by the wet chemical etching process. Depending upon the thickness of the dielectric layer 58 to be removed to define the recess 55, the plasma exposure and wet etching processes may be conducted in a series of cycles to remove greater material thicknesses.

In an alternative embodiment, the dielectric layer 58 may be completely removed so that the recess 55 extends in depth to the level of a top surface 96 of the dielectric layer 50, as described below in the context of FIG. 7A. In another alternative embodiment, the recess 55 may be extended in depth into the dielectric layer 50 by further recessing the top surface 96, as described below in the context of FIG. 7B. In alternative embodiments, the dielectric layer 58 may be partially or wholly removed without plasma exposure using a wet etch, such as DHF, or a dry etch, such as a perfluorocarbon-based reactive ion etching (RIE) process.

Figure 3:
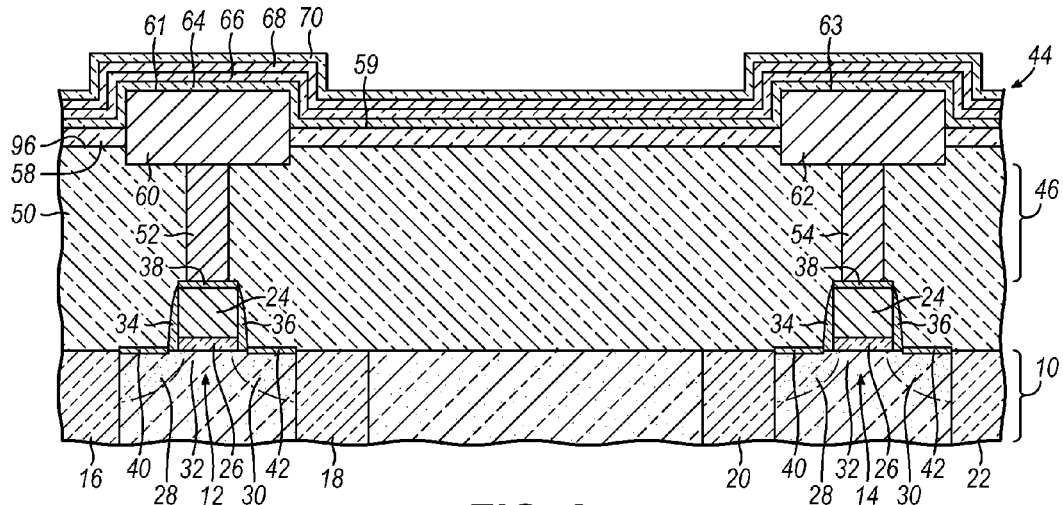

With reference to FIG. 3 in which like reference numerals refer to like features in FIG. 2 and at a subsequent fabrication stage, a conformal stack of layers 64, 66, 68, 70 is sequentially deposited across the top surfaces 61, 63 of the wires 60, 62 and across the recessed top surface 59 of the dielectric layer 58. Layers 66 and 68 are disposed between layer 64 and layer 70, and layer 64 is disposed in direct contact with the recessed top surface 59 of the dielectric layer 58. Portions of the layers 64, 66, 68, 70 are disposed in the recess 55 between the wires 60, 62.

Layers 64 and 70 represent etch stop caps composed of a dielectric material, such as $SiN_x$ or nitrogen-doped silicon carbide ($SiN_xC_yH_z$). Layer 66 is composed of a dielectric material, which may be identical to the dielectric material contained in dielectric layer 58, i.e. FSG, $SiO_2$, SiCOH, etc. Layer 68 is composed of a conductive material, such as TiN, TaN, tantalum (Ta), titanium (Ti), W, tungsten nitride (WN), ternary refractory metals like titanium silicon nitride (TiSiN), tantalum silicon nitride (TaSiN), and tungsten silicon nitride (WSiN), and may be deposited by direct current (DC) sputtering or radio frequency (RF) sputtering. In an alternative embodiment, layers 64 and 66 are combined into a single dielectric layer and may be composed of $SiN_x$, $SiN_xC_yH_z$, $SiO_2$, FSG, SiCOH, etc.

Figure 4:
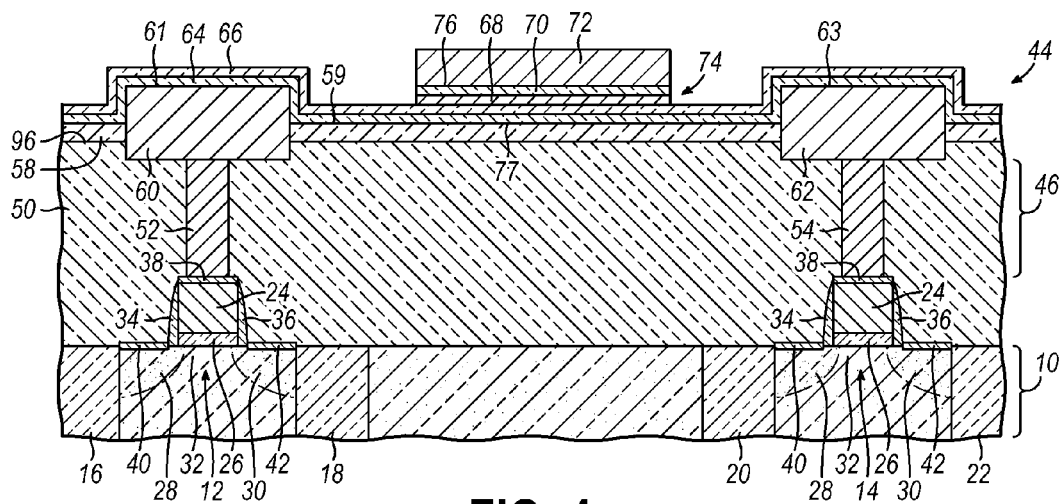
Figure 7:
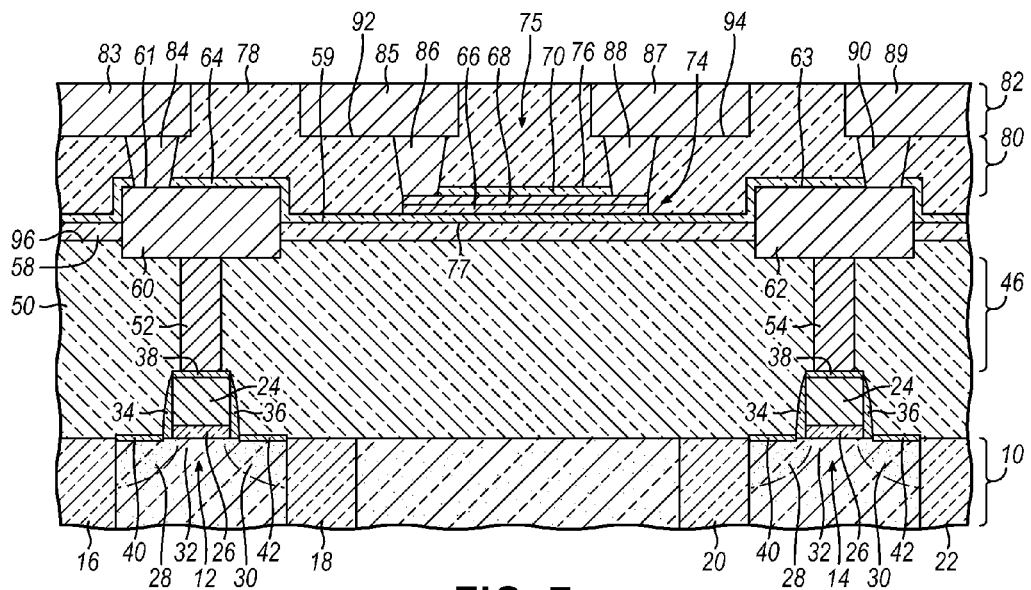

With reference to FIG. 4 in which like reference numerals refer to like features in FIG. 3 and at a subsequent fabrication stage, a photoresist layer 72 composed of a sacrificial organic material is applied on a top surface of layer 70 and photolithographically patterned in a conventional manner. A dry etching process, such as RIE, is used to shape the layers 68 and 70 by removing portions not masked by the photoresist layer 72 and to define a body 74 of conductive material from layer 68 for use in an on-chip resistor 75 (FIG. 7). The resistance value of the body 74 is determined by selection of, among other variables, the composition, the thickness, and the planar geometry of the deposited and shaped layer 68. In one embodiment, the body 74 has a width of about 10 microns and a length of about 40 microns. The body 74 is disposed in the recess 55 laterally between the wires 60, 62.

The body 74 has a top surface 76 that is approximately co-planar with the top surface 61 of wire 60 and the top surface 63 of wire 62. The approximate co-planarity is achieved by a selection of the depth of the recess 55 and the physical layer thicknesses for the layers 64, 66, 68. Specifically, the physical layer thicknesses of layers 64, 66, 68 are selected such that the composite thickness for layers 64, 66, 68 is approximately equal to the difference in height, $h_1$, between the top surfaces 61, 63 of the wires 60, 62 and the top surface 59 of the recessed dielectric layer 58. In one embodiment, the layers 64 and 70 may each have a physical thickness of about 35 nm, layer 66 may have a physical thickness of about 30 nm, layer 68 may be about 40 nm thick, and the recess 55 may have a depth of 140 nm.

Figure 5:
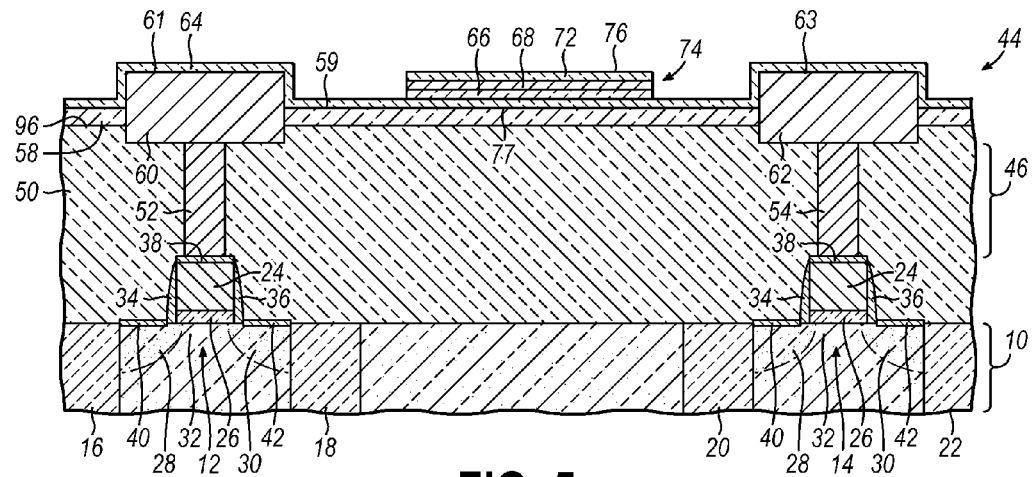

With reference to FIG. 5 in which like reference numerals refer to like features in FIG. 4 and at a subsequent fabrication stage, the photoresist layer 72 is removed from the body 74 with a wet chemical stripper or a dry oxidation-based photoresist removal technique. Layer 66, which may be damaged by the dry etching forming the body 74, is removed by a wet chemical etching process such as, for example, a dip in a DHF solution that removes layer 66 selective to layer 64 and the portion of layer 70 residing on body 74. Only a portion of layer 66 masked by the body 74 remains after the conclusion of the etching process. A bottom surface 77 of the body 74 is in indirect contact with the dielectric layer 58.

Figure 6:
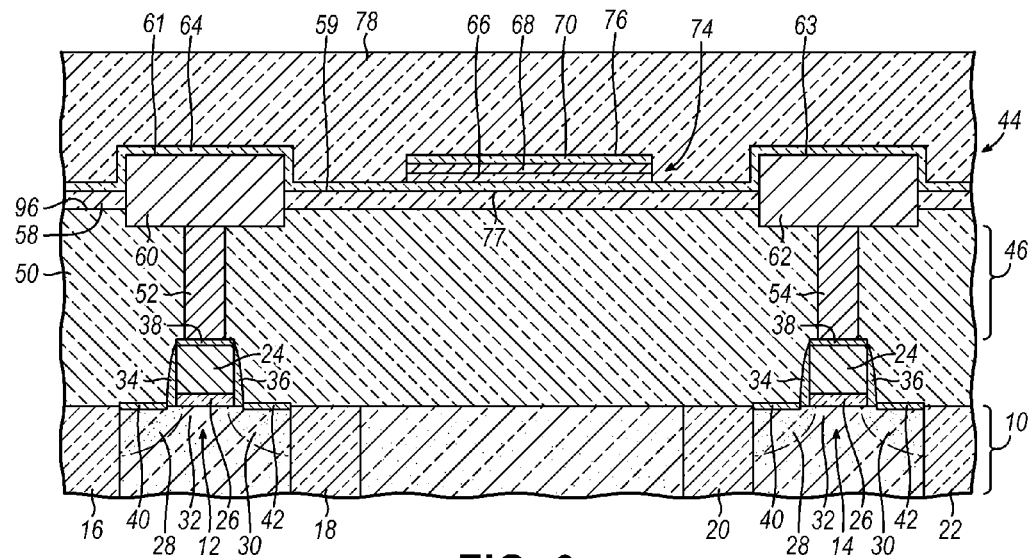

With reference to FIG. 6 in which like reference numerals refer to like features in FIG. 5 and at a subsequent fabrication stage, a blanket dielectric layer 78 is applied. The dielectric layer 78 is composed of an electrically-insulating dielectric material deposited by a conventional method understood by a person having ordinary skill in the art. In one embodiment, the dielectric layer 78 may be composed of $SiO_2$ or FSG deposited by a CVD or PECVD process. Alternatively, the dielectric material constituting dielectric layer 78 may be characterized by a relative permittivity or dielectric constant smaller than the relative dielectric constant of silicon dioxide, which is about 3.9. Candidate low-k dielectric materials for dielectric layer 78 include, but are not limited to, porous and nonporous spin-on organic low-k dielectrics, porous and nonporous inorganic low-k dielectrics, such as organosilicate glasses, and combinations of organic and inorganic dielectrics. Any uneven surface topology of dielectric layer 78 from the presence of the wires 60, 62 and the body 74 of the on-chip resistor 75 is alleviated by planarizing with, for example, a CMP process.

With reference to FIG. 7 in which like reference numerals refer to like features in FIG. 6 and at a subsequent fabrication stage, a first via (V1) level 80 and a second metallization (M2)

level 82 are formed using the dielectric layer 78. The V1 level 80 and M2 level 82 may be formed, for example, by a dual damascene process as understood by a person having ordinary skill in the art. To that end, studs 84, 86, 88, 90 and wires 83, 85, 87, 89 may be formed by defining wiring trenches and vias in dielectric layer 78 by a conventional photolithography and etching process, and filling these wiring trenches and vias with a conductor. Studs 84, 86, 88, 90 extend through the layers 64, 70, which are etched during the process etching the vias in the dielectric layer 78 for studs 84, 86, 88, 90.

Stud 84 in the V1 level 80 electrically connects wire 83 in the M2 level 82 with the wire 60 in the M1 level 48. Similarly, stud 90 in the V1 level 80 electrically connects wire 89 in the M2 level 82 with the wire 62 in the M1 level 48. Studs 86, 88 in the V1 level 80, which also extend through the remnant of layer 70, connect respective opposite ends of the body 74 with wires 85, 87 formed in the M2 level 82.

Studs 84, 86, 88, 90 and wires 83, 85, 87, 89 are composed of a conductor such as copper (Cu), aluminum (Al), binary alloys such as AlCu, and other similar metals. These materials are deposited and planarized by conventional processes understood by a person having ordinary skill in the art of damascene process. Liner layers (not shown) may be applied that separate the studs 84, 86, 88, 90 and wires 83, 85, 87, 89 from the dielectric material of dielectric layer 78. The liner layers may be composed of one or more thin films of a conductor such as Ta, TaN, Ti, TiN, W, ruthenium (Ru), iridium (Ir), rhodium (Rh), platinum (Pt), chromium (Cr), niobium (Nb), or another suitable conductor with material properties appropriate to operate, among other attributes, as a diffusion barrier and an adhesion promoter.

Additional metallization levels and via levels (not shown) may be stacked above the M2 level 82 and may be fabricated by processes similar to those described in relation to FIGS. 6 and 7.

The presence of the recess 55 spatially places all portions of the on-chip resistor 75 farther from the bottom surfaces 92, 94 of wires 85, 87 than in a conventional construction in which the recess 55 is absent. When the vias for the studs 84, 86, 88, 90 are etched during the damascene process, the etch front in the dielectric layer 78 reaches the top surfaces 61, 63, 76 at more similar etch times than in conventional constructions for an on-chip resistor. As a result, the risk of etching through the body 74 of the on-chip resistor 75 is significantly reduced because the vias for the studs 86, 88 are not deepened into the body 74 by excessive overetching of the vias for the studs 84, 90.

Because the top surface 76 of the body 74 is approximately co-planar with the top surfaces 61, 63 of wires 60, 62, the studs 84, 86, 88, 90 and the vias that contain the studs 84, 86, 88, 90 all have approximately the same height and, as a result, will be formed with approximately the same cumulative etch time. Recessing the top surface 76 of the body 74 also reduces the likelihood that the bottom surfaces 92, 94 of wires 85, 87 will electrically short to the top surface 76 of the body 74, as observed with conventional resistor constructions because of the variability of CMP processes used in planarization and shrinking via heights in advanced technology nodes. The recess 55 moves the body 74 closer to the substrate 10, which operates as a heat sink, than in conventional constructions for on-chip resistors. As a result, the conduction path for heat rejection from the on-chip resistor 75 is shortened in comparison with conventional on-chip resistor constructions.

Alternatively and described below with regard to FIGS. 7A and 7B, the depth of the recess 55 and the physical layer thicknesses for the layers 64, 66, 68 may be chosen such that the top surface 76 of the body 74 is below the respective top surfaces 61, 63 of wires 60, 62. In this alternative embodiment, the studs 86, 88 and the vias that contain the studs 86, 88 will be taller than studs 84, 90 so that the effect of overetch on the vias containing the studs 86, 88 will be further reduced.

Figure 7A:
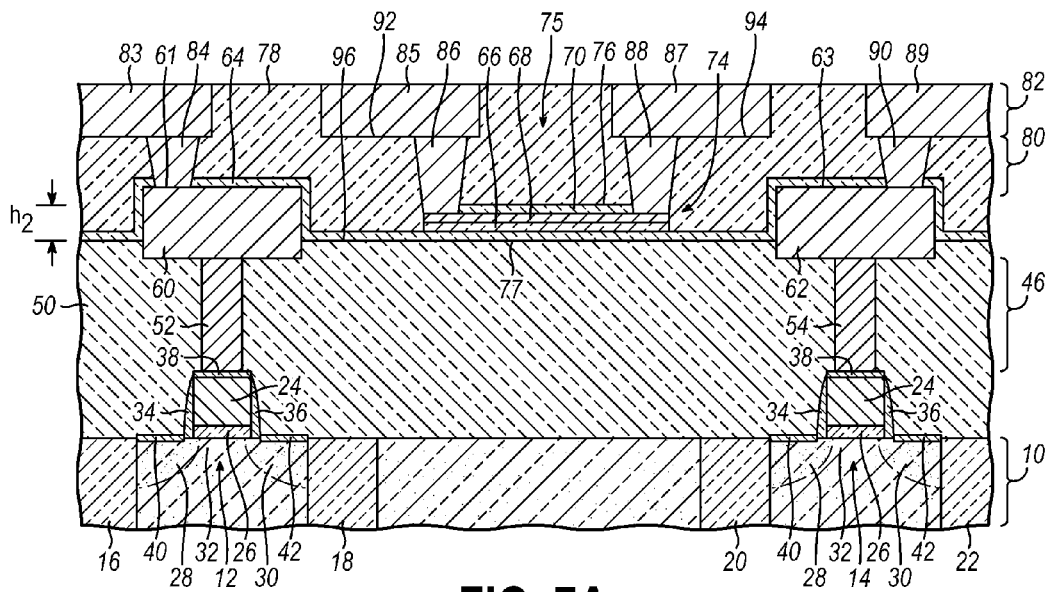
FIG. 7A is a diagrammatic cross-sectional view similar to FIG. 7 in accordance with an alternative embodiment of the invention.

With reference to FIG. 7A in which like reference numerals refer to like features in FIG. 7 and in accordance with an alternative embodiment of the invention, dielectric layer 58 may be completely removed during the formation of the recess 55 between wires 60, 62. As a consequence, the bottom surface 77 of the body 74 is placed in indirect contact with the dielectric layer 50 because of the presence of the residual portions of layers 64, 66. The parameters for the etching process used to remove the dielectric layer 58 may be adjusted to stop on the top surface 59 of dielectric layer 50. The difference in height, $h_2$, between the top surfaces 61, 63 of the wires 60, 62 and the top surface 59 of dielectric layer 50 is approximately equal to the physical layer thickness of the dielectric layer 58. The depth of the recess 55 is greater than the physical thickness of layers 64, 66 so that the top surface 76 of body 74 is recessed below the respective top surfaces 61, 63 of wires 60, 62. This spatial relationship places the entire body 74 even further from the bottom surfaces 92, 94 of wires 85, 87 than in conventional constructions. Alternatively, the depth of recess 55, along with the thicknesses of layers 64 and 66, may be chosen such that the top surface 76 of body 74 is approximately coplanar with the respective top surfaces 61, 63 of wires 60, 62.

If dielectric layer 58 is formed from SiCOH or porous SiCOH, which has relatively poor thermal conductivity, then a significant improvement in heat dissipation can be obtained by placing the body 74 in direct contact with dielectric layer 50, which may be formed from a material characterized by a higher thermal conductivity such as BPSG. In particular, landing the body 74 on the dielectric layer 50 may operate to improve thermal conduction of heat away from the body 74 if the dielectric layer 50 is composed of dielectric material, such as BPSG, that has a relatively high thermal conductivity in comparison to other dielectric materials, such as SiCOH or porous SICOH, commonly used to form the dielectric layer 58. For example, BPSG, which is a candidate material for dielectric layer 50, has a thermal conductivity greater than 1.0 W/cm·K, in comparison with a thermal conductivity for SiCOH of approximately 0.21 W/cm·K. Another candidate material for dielectric layer 50 is diamond, which has a thermal conductivity of about 1000 W/cm·K. In particular, dielectric layer 50 may be composed of a dielectric material having thermal conductivity in the range of about 1 to about 1000 W/m·K. In addition, by completely removing the dielectric layer 58, the body 74 of the on-chip resistor 75 is moved even closer to the heat sink defined by the substrate 10 in comparison with conventional on-chip resistor constructions. As a result, heat dissipation from the on-chip resistor 75, during operation, may be more efficient in comparison with conventional the on-chip resistors that directly contact the intermetal dielectric serving as an etch stop layer.

Figure 7B:
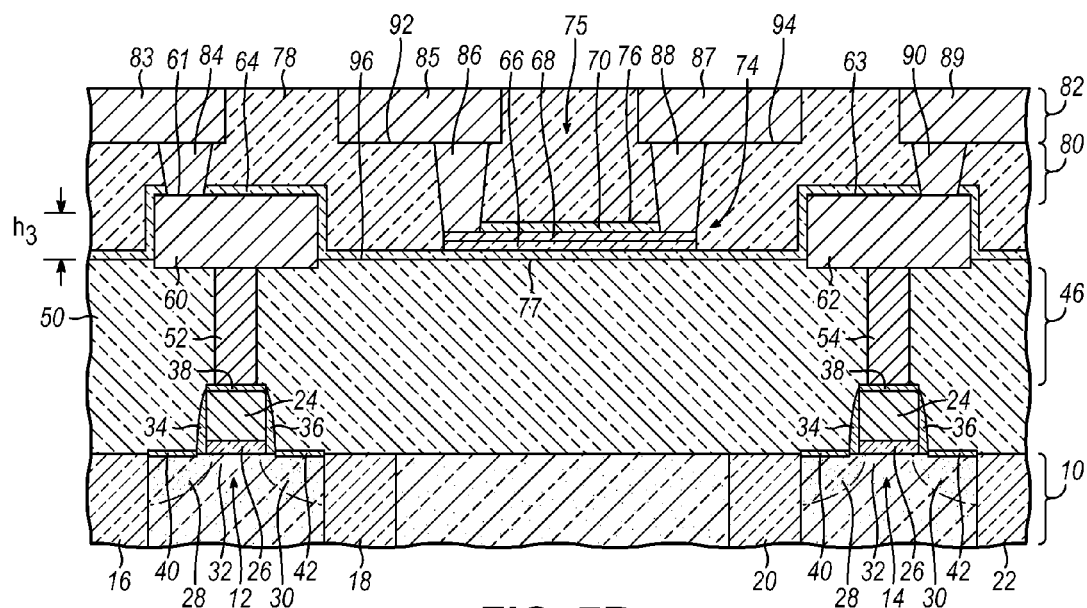
FIG. 7B is a diagrammatic cross-sectional view similar to FIG. 7A in accordance with an alternative embodiment of the invention.

With reference to FIG. 7B in which like reference numerals refer to like features in FIG. 7A and in accordance with an alternative embodiment of the invention, the recess 55 between the wires 60, 62 may be further extended in depth by etching downwardly into the dielectric layer 50 after the dielectric layer 58 is completely removed. The difference in height, $h_3$, between the top surfaces 61, 63 of the wires 60, 62 and the top surface 96 of the dielectric layer 50 is greater than the physical layer thickness of the dielectric layer 58. The bottom surface 77 of the body 74 is in indirect contact with the dielectric layer 50 because of the presence of the residual portions of layers 64, 66. The additional depth may permit additional heightening of the body 74 of the on-chip resistor 75. The depth of the recess 55 is greater than the physical thickness of layers 64, 66 so that the top surface 76 of body 74 is recessed below the respective top surfaces 61, 63 of wires 60, 62. Alternatively, the depth of recess 55, along with the thicknesses of layers 64 and 66, may be chosen such that the top surface 76 of the body 74 is approximately coplanar with the top surfaces 61, 63 of wires 60, 62.

Consistent with the embodiments of the invention, the blanket recess or removal of the intermetal dielectric represented by dielectric layer 58 across the entire substrate 10 can performed without the need for an additional photomask. The blanket removal or recess of the dielectric layer 58 promotes alignment and overlay between the alignment key on the photomasks used to make the on-chip resistor 75 and the alignment target on the substrate 10. As mentioned above, the blanket recess or removal of the intermetal dielectric represented by dielectric layer 58 mitigates the potential for damage from via overetch of the vias that are used to contact metallization features in the underlying CA level 46.

The fabrication process described with regard to FIGS. 1-7, 7A, 7B is equally applicable to other types of on-chip passive elements, such as a metal-insulator-metal (MIM) capacitor. The following description of an alternative embodiment of the invention specifically pertains to a MIM capacitor, but is not so limited.

Figure 8:
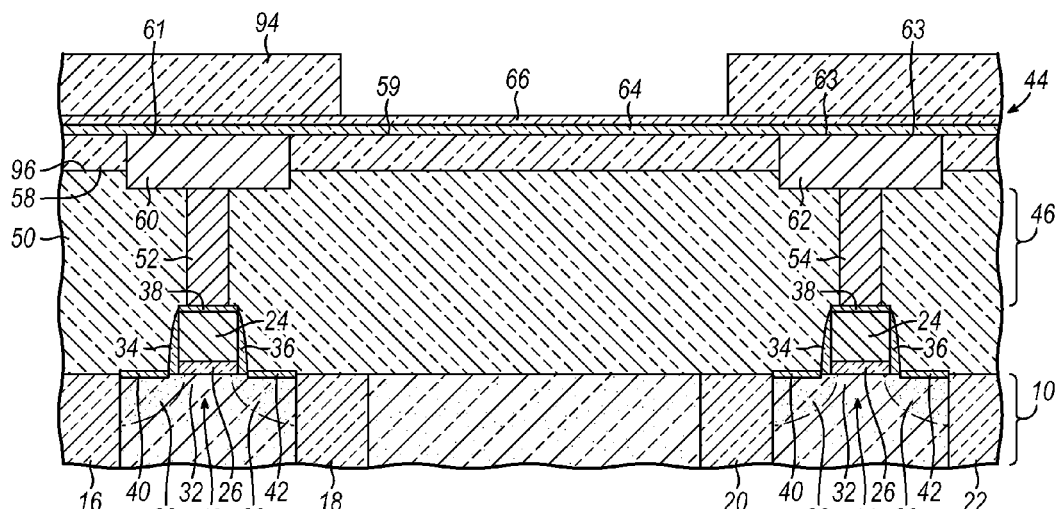
FIGS. 8-12 are diagrammatic cross-sectional views of the portion of the BEOL interconnect structure of FIG. 1 at a series of subsequent fabrication stages in accordance with an alternative embodiment of the invention.

With reference to FIG. 8 in which like reference numerals refer to like features in FIGS. 1-7 and at a fabrication stage subsequent to FIG. 1 in accordance with an alternative embodiment of the invention, the layers 64 and 66 are deposited and a resist layer 94 is applied on layer 66. Resist layer 94 is photolithographically patterned in a conventional manner to mask a portion of the layers 64, 66. A dry etching process, such as RIE or another type of plasma etching, is used to remove portions of layers 64, 66 unmasked by resist layer 94.

Figure 9:
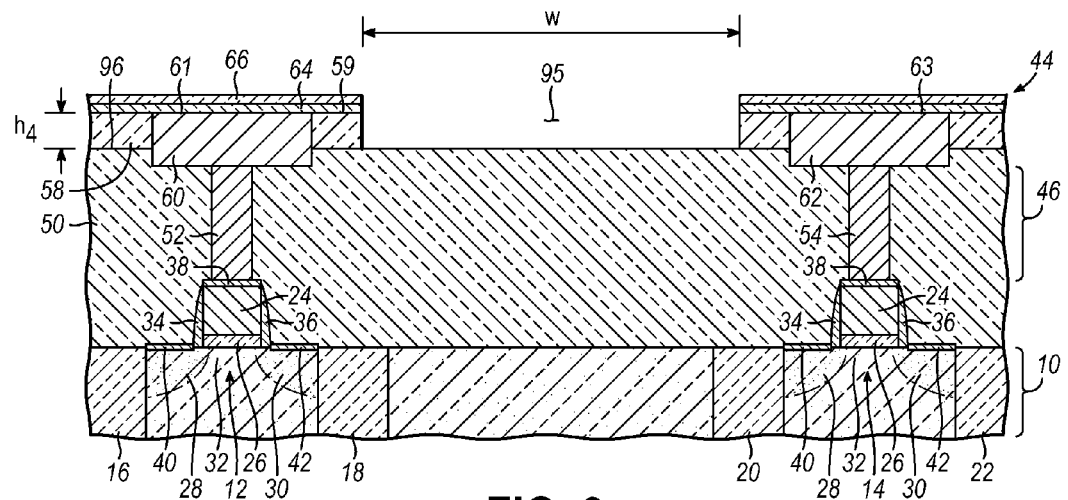

With reference to FIG. 9 in which like reference numerals refer to like features in FIG. 8 and at a subsequent fabrication stage, the top surface 59 of the dielectric layer 58 is recessed relative to the respective top surfaces 61, 63 of wires 60, 62 to define a recess 95. The depth of the recess 95 extends to the top surface 96 of dielectric layer 50. A dry etching process, such as an RIE process, may be applied to physically recess the dielectric layer 58. The conditions for the dry etching process are selected such that the top surface 96 of the dielectric layer 50 operates as an etch stop. As a result, the difference in height, $h_4$, between the top surfaces 61, 63 of the wires 60, 62 and the top surface 96 of the dielectric layer 50 is equal to the physical layer thickness of the dielectric layer 58.

Figure 10:
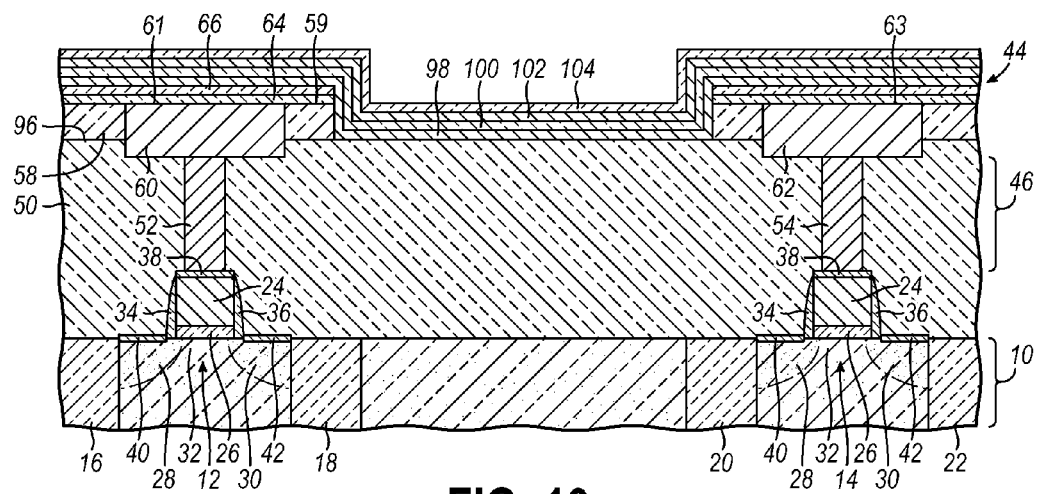

With reference to FIG. 10 in which like reference numerals refer to like features in FIG. 9 and at a subsequent fabrication stage, a conformal stack of layers 98, 100, 102, 104 is sequentially deposited across the top surfaces 61, 63 of the wires 60, 62 and the top surface 96 of the dielectric layer 50. Layers 98 and 102 are composed of one or more conductive materials, such as a refractory metal, such as TiN, TaN, Ta, Ti, W, WN, or a ternary material like TiSiN, TaSiN, and WSiN. Refractory metals may be deposited by direct current (DC) sputtering or radio frequency (RF) sputtering. Alternatively, layers 98 and 102 may contain multi-layered combinations of these refractory metals, such as either W or Ta clad below and above with either TiN or TaN, or may be composed of Al, Cu, or an AlCu alloy. Layers 98 and 102 may be composed of the same or different conductive materials.

Layer 100 may be composed of $SiO_2$, $Si_3N_4$, $Al_2O_3$, $ZrO_2$, tantalum pentoxide ($Ta_2O_5$), a hafnium-based dielectric material like $HfO_2$, a hafnium silicate (HfSiO), or HfSiON, layered stacks of these materials, and other like materials. These types of insulator materials may be deposited by atomic layer deposition (ALD), a CVD process, or another conventional deposition technology. Layer 104 is an optional etch stop cap for the material in layer 102 and may be composed of a material like $Si_3N_4$ or SiCN.

Figure 11:
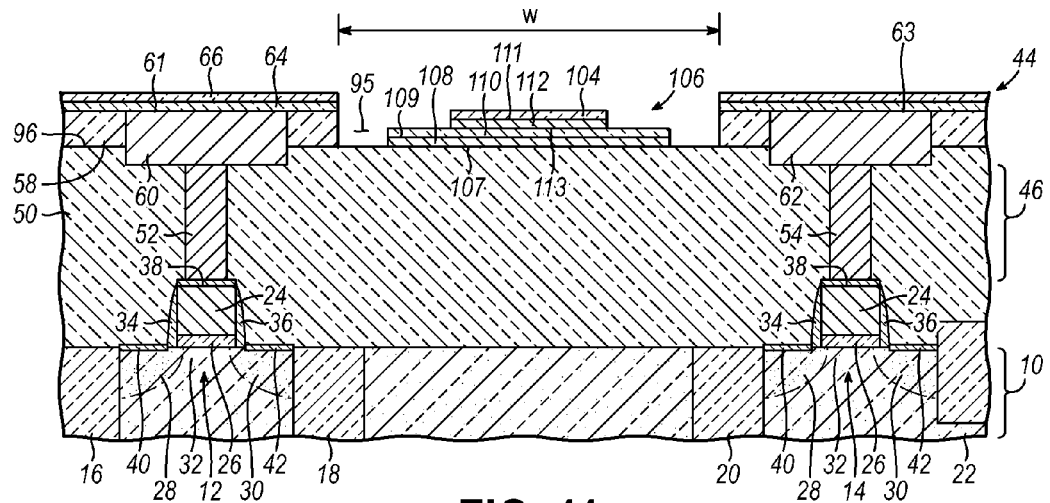

With reference to FIG. 11 in which like reference numerals refer to like features in FIG. 10 and at a subsequent fabrication stage, layers 98, 100, 102, 104 (FIG. 10) are patterned using a conventional lithography and etching process to define a metal-insulator-metal (MIM) capacitor, which is generally indicated by reference numeral 106, that is characterized by tiered side edges that promote the formation of electrical contacts. Specifically, a resist layer (not shown) is applied on layer 104 and patterned to reflect a desired top or bottom plate geometry for the MIM capacitor 106. In one embodiment, layers 98, 100, 102, 104 are etched such that layer 98 forms a bottom plate 108 of the MIM capacitor 106, followed by a resist strip. Next, another resist layer (not shown) is applied on layer 104 and patterned to reflect a desired top plate 112 of the MIM capacitor 106. Layers 102, 104 are etched to form the MIM top plate 112, followed by a resist strip. In an alternative embodiment, the top plate 112 of the MIM capacitor 106 is patterned and etched first, followed by a second patterning and etching step to form the bottom plate 108 of the MIM capacitor 106. The resist layers are removed with a wet chemical stripper or a dry oxidation-based photoresist removal technique. The width, w, of the recess 95 is selected as a design parameter such that the side edges of the MIM capacitor 106 can be successfully formed by the RIE process.

The interplate dielectric 110, which is fashioned from layer 102, is disposed between the bottom and top plates 108, 112, which function as electrodes for the MIM capacitor 106. The interplate dielectric 110, which is typically thinner than the bottom and top plates 108, 112, functions to electrically isolate the top plate 112 from the bottom plate 108. A peripheral edge portion of the bottom plate 108 projects laterally outside of the footprint of the top plate 112 and the interplate dielectric 110, which promotes the ability to electrically contact the bottom plate 108 from above but is not limiting of this embodiment of the invention. Dielectric spacers (not shown) may be formed on the side edges of the bottom plate 108, top plate 112, and interplate dielectric 110. A portion of layer 104 remains as an etch stop on a top surface 111 of the top plate 112. The bottom plate 108 has a bottom surface 113 that is in direct contact with the top surface 96 of the dielectric layer 50.

The MIM capacitor 106 has a two-electrode construction in the representative embodiment, but may have a different construction recognized by a person having ordinary skill in the art. For example, additional plates and interplate dielectric layers (not shown) can be added to the construction of the MIM capacitor 106 to provide three-electrode, four-electrode, etc. constructions. In each instance, the depth of the recess 95 and the layer thicknesses can be adjusted to accommodate the MIM capacitor 106.

Figure 12:
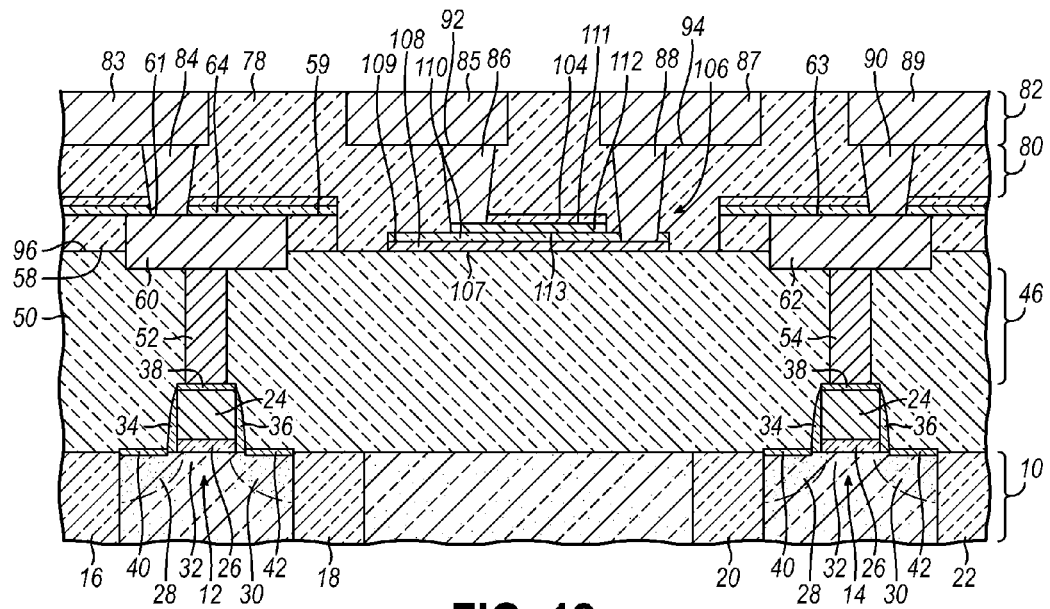

With reference to FIG. 12 in which like reference numerals refer to like features in FIG. 11 and at a subsequent fabrication stage, the V1 level 80 and M2 level 82 are formed by, for example, a dual damascene process using the dielectric layer 78, as described above in the context of FIGS. 6 and 7. Portions of the dielectric layer 78 fill the previously unfilled recess 95 between the wires 60, 62 and in which the MIM capacitor 106 is disposed. Studs 84, 86, 88, 90 and wires 83, 85, 87, 89 are formed in the dielectric layer 78. Stud 86 in the V1 level 80, which extends through layer 104, connects the top plate 112 with wire 87 in the M2 level 82. Stud 88 in the V1 level 80, which extends through layer 100, connects the bottom plate 108 with wire 85 in the M2 level 82. Although the bottom plate 108 is depicted as being contacted by vias from above, the bottom plate 108 may be contacted alternatively from below by vias or contacts (not shown).

Because the on-chip MIM capacitor 106 is disposed in the recess 95, the bottom and top plates 108, 112 are closer to the top surfaces 61, 63 of the wires 60, 62 and are placed further from the bottom surfaces 92, 94 of wires 85, 87 than in conventional MIM capacitor constructions. When the vias for the studs 84, 86, 88, 90 are etched during the damascene process, the etch front in the dielectric layer 78 reaches the top surfaces 61, 63, 107, 109 with a reduced difference in etch time when compared with conventional constructions in which the height difference between the vias for the studs 84, 90 and the vias for the studs 86, 88 is greater. Because of the reduced via height difference, the risk of etching through the top plate 112 of the on-chip MIM capacitor 106 during overetching is significantly reduced in comparison to conventional MIM capacitor constructions.

In one embodiment, the depth of the recess 95 and the layer thicknesses for layers 98, 100, 102 are selected so that a top surface 109 of the top plate 112, which is the uppermost conductor of the MIM capacitor 106, is disposed approximately co-planar with the top surfaces 61, 63 of the wires 60, 62. As a result, the studs 86, 88 and their vias have approximately the same height as the studs 84, 90 and their vias. When the vias for the studs 84, 86, 88, 90 are etched during the damascene process, the etch front in the dielectric layer 78 reaches the top surfaces 61, 63, 107, 109 at approximately the same etch time. The presence of the recess 95 lessens the risk that overetch will penetrate through the top plate 112 and all or the majority of the MIM capacitor 106 is situated further from the bottom surfaces 92, 94 of wires 85, 87 than in conventional MIM capacitor constructions.

The recess 95 has a profile that is non-retrograde with substantially vertical sidewalls virtue the anisotropic process forming recess 95. The retrograde profile enhances the subsequent patterning of the conductors of the MIM capacitor 106 with an anisotropic dry etching process. Because the wires 60, 62 of the CA level 46 are protected by layer 98 during the etching process forming the recess 95, the dielectric material of the dielectric layer 58 can be removed by a reactive ion etching process. The recess 95 is bordered laterally by residual portions of the dielectric layer 58 such that the MIM capacitor 106 is inside the recess 95 and optimized spacing rules may be used to eliminate residuals from the RIE processes.

In an alternative embodiment, the depth of the recess 95 and the layer thicknesses for layers 98, 100, 102 may be selected such that the top surface 111 of the top plate 112 is below the top surfaces 61, 63 of the wires 60, 62.

Figure 12A:
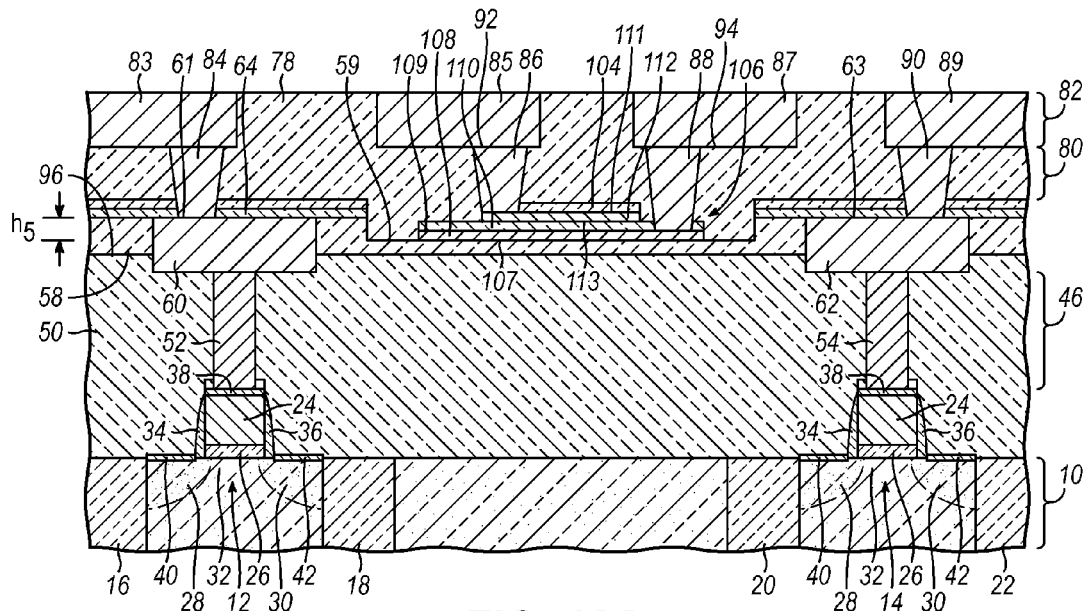
FIGS. 12A and 12B are diagrammatic cross-sectional views similar to FIG. 12 in accordance with alternative embodiments of the invention.

With reference to FIG. 12A in which like reference numerals refer to like features in FIG. 12 and in accordance with an alternative embodiment of the invention, the depth of the recess 95 is reduced such that a thin portion of the dielectric layer 58 remains. The bottom surface 113 of bottom plate 108 is then in direct contact with the dielectric layer 58. The depth of recess 95 may be chosen in conjunction with the physical layer thicknesses of layers 98, 100, 102 such that the top surface 111 of the top plate 112 is approximately coplanar with, or below, the top surfaces 61, 63 of wires 60, 62.

Figure 12B:
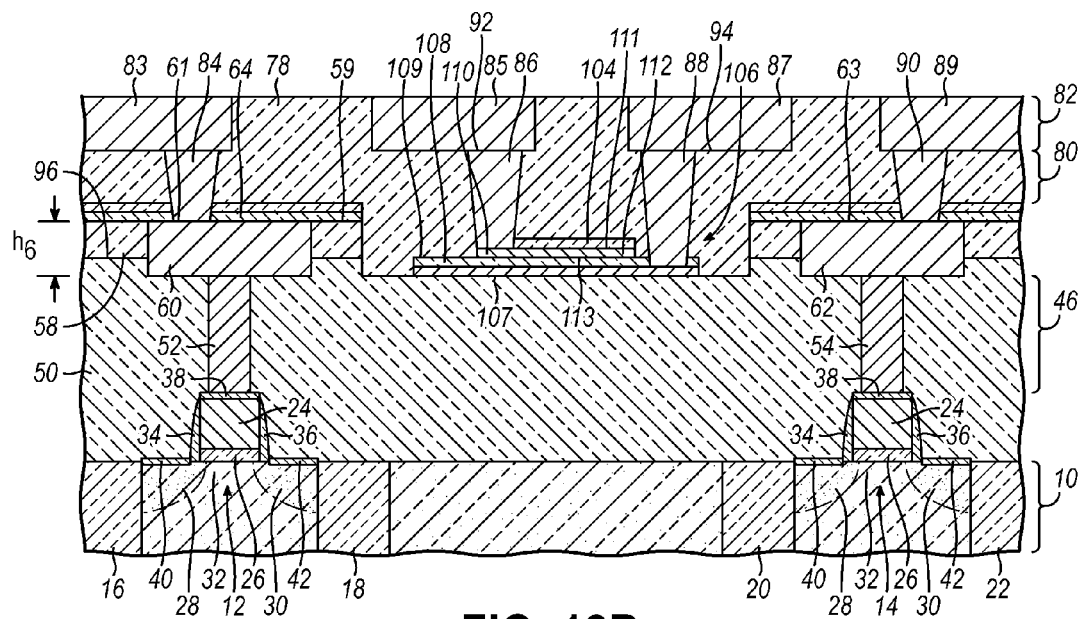

With reference to FIG. 12B in which like reference numerals refer to like features in FIG. 12 and in accordance with an alternative embodiment of the invention, the recess 95 may be extended to a greater depth into the dielectric layer 50, after the etch stop player 58 is removed in FIG. 12, by continuing the etching process with an etch recipe that is capable of removing the dielectric material constituting the dielectric layer 50. The depth of recess 95 and the physical layer thicknesses of layers 98, 100, 102 may be chosen such that the top surface 111 of the top plate 112 is approximately coplanar with, or below, the top surfaces 61, 63 of wires 60, 62.

Figure 13:
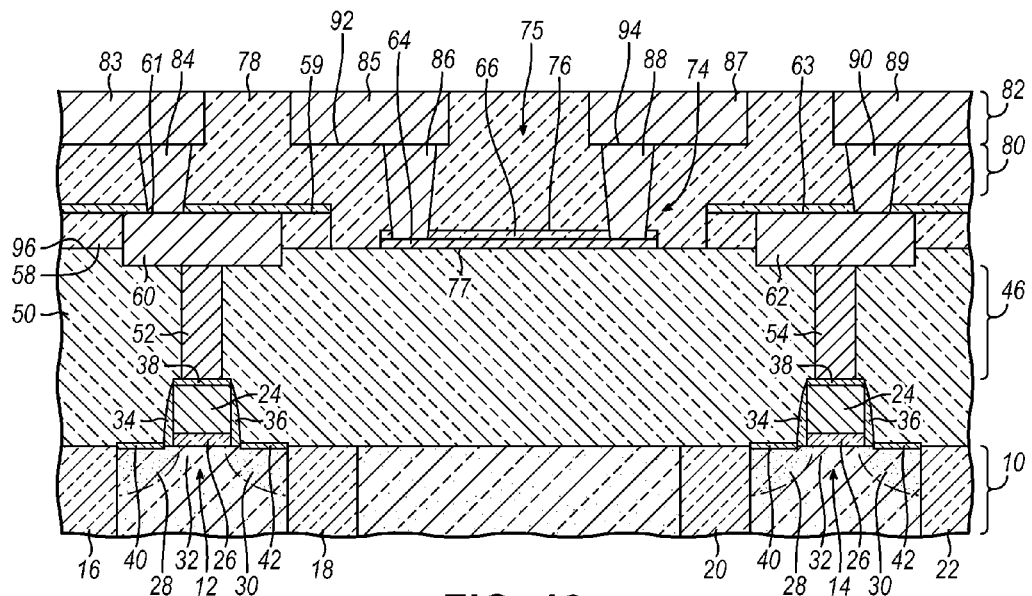
FIG. 13 is a diagrammatic cross-sectional view similar to FIG. 12 illustrating an alternative embodiment of the invention.

With reference to FIG. 13 in which like reference numerals refer to like features in FIGS. 7 and 12 and in accordance with an alternative embodiment, the recess 95 may be used in conjunction with the on-chip resistor 75. In this instance, the top surface 76 of the body 74 is approximately co-planar with, or below, the top surface 61 of wire 60 and the top surface 63 of wire 62. Consequently, the studs 84, 86, 88, 90 all have approximately the same height and problems with overetch of conventional vias for studs 86, 88 causing harm to the body 74 are mitigated. In the representative embodiment, the bottom surface 77 of the body 74 is in direct contact with the dielectric layer 50 because the dielectric layer 58 has been removed. Landing the on-chip resistor 75 on the dielectric material of the CA level 46 may operate to improve thermal conduction for dielectric materials, such as BPSG, that have a relatively high thermal conductivity.

Figure 14:
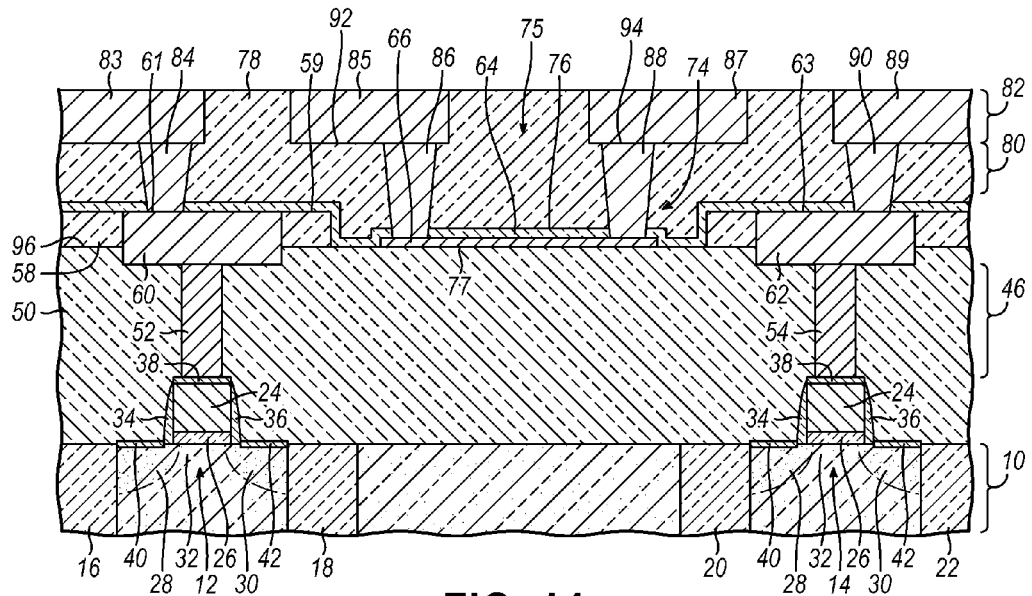
FIG. 14 is a diagrammatic cross-sectional view similar to FIG. 13 illustrating an alternative embodiment of the invention.

With reference to FIG. 14 in which like reference numerals refer to like features in FIG. 13 and in accordance with an alternative embodiment, the structure has been altered by applying layer 64 after the recess 95 is formed in the dielectric layer 58. If dielectric layer 58 is composed of a SiCOH-based material, then the plasma used to strip the resist layer 94 (FIG. 8) should be non-oxidizing so that the dielectric layer 58 is not damaged or oxidized during the formation of the recess 95. In one embodiment, the resist-stripping plasma may be formed from a mixture of hydrogen ($H_2$) and nitrogen ($N_2$) process gases.

Figure 15:
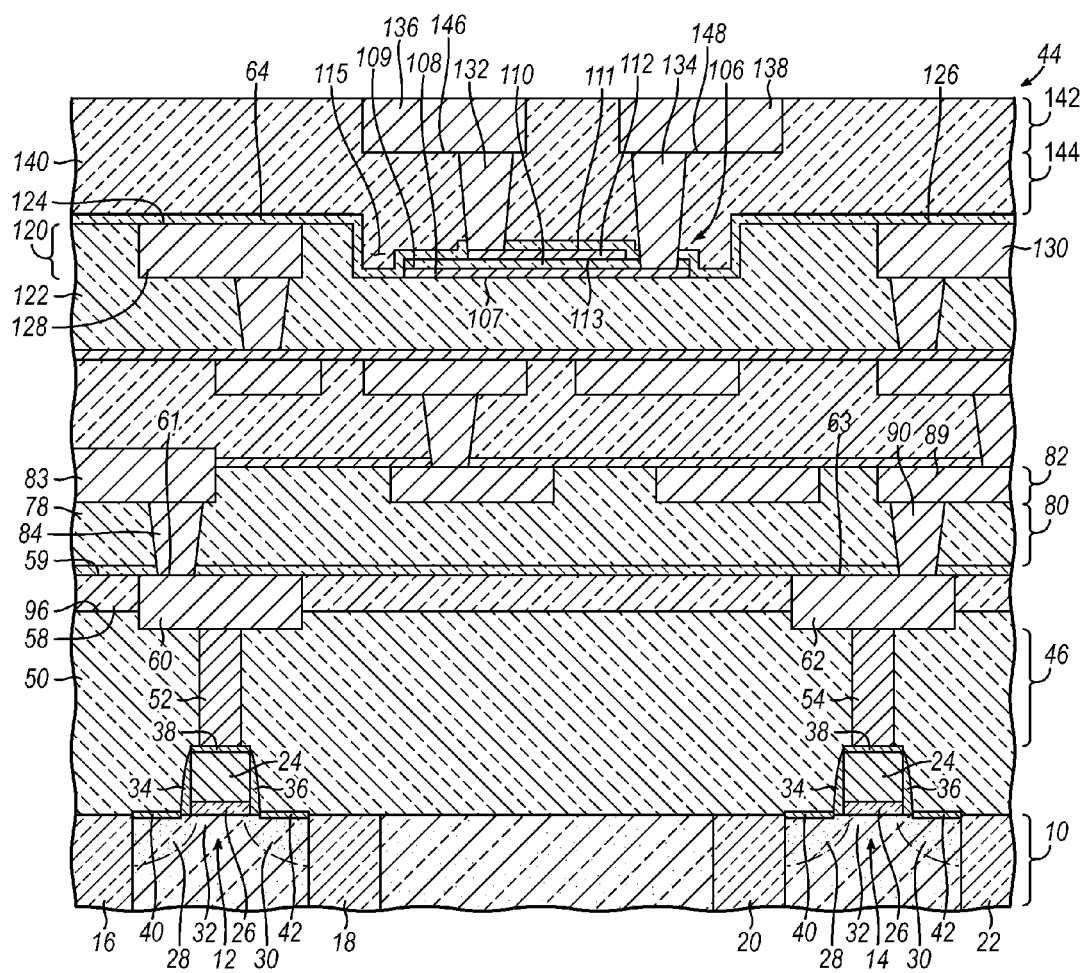
FIG. 15 is a diagrammatic cross-sectional view similar to FIG. 12 illustrating an alternative embodiment of the invention in which the MIM capacitor is located in an upper metallization level of the BEOL interconnect structure.

With reference to FIG. 15 in which like reference numerals refer to like features in FIG. 12 and in accordance with an alternative embodiment, the MIM capacitor 106 may be located in an upper metallization level, such as the representative fourth metallization (M4) level 120 having a dielectric layer 122, of the BEOL interconnect structure 44 rather than in the M1 level 48 (FIG. 1). A recess 115, which is similar to recesses 55 and 75, is formed in the dielectric layer 122. By adjusting the depth of the recess 115 in dielectric layer 122 and the physical layer thicknesses of the layers used to form the bottom and top plates 108, 112 and the interplate dielectric 110, the top surface 111 of the top plate 112 may be located approximately coplanar with, or below, top surfaces 124, 126 of wires 128, 130 in the M4 level 120.

Studs 132, 134 and wires 136, 138 are formed in a dielectric layer 140 of a metallization (M5) level 142 and a via (V4) level 144 above the M4 level 120. Stud 132 in the V4 level 142 extends through the dielectric layer 140 to connect the top plate 112 with wire 136 in the M5 level 144. Stud 134 in the V4 level 142 extends through the dielectric layer 140 to connect the bottom plate 108 with wire 138 in the M5 level 144. In the illustrated embodiment, layer 64 is applied after the recess 95 for the MIM capacitor 106 is formed in the dielectric layer 122 of the M4 level 120, as described with regard to FIG. 14.

The presence of the recess 115 in the dielectric layer 122 places all portions of the MIM capacitor 106 farther from the bottom surfaces 146, 148 of wires 136, 138 than in a conventional construction in which the recess 115 is absent. As explained herein, various benefits may be attributable to the recess 115. In an alternative embodiment, the on-chip resistor 75 may be substituted for the MIM capacitor 106.

Figure 16:
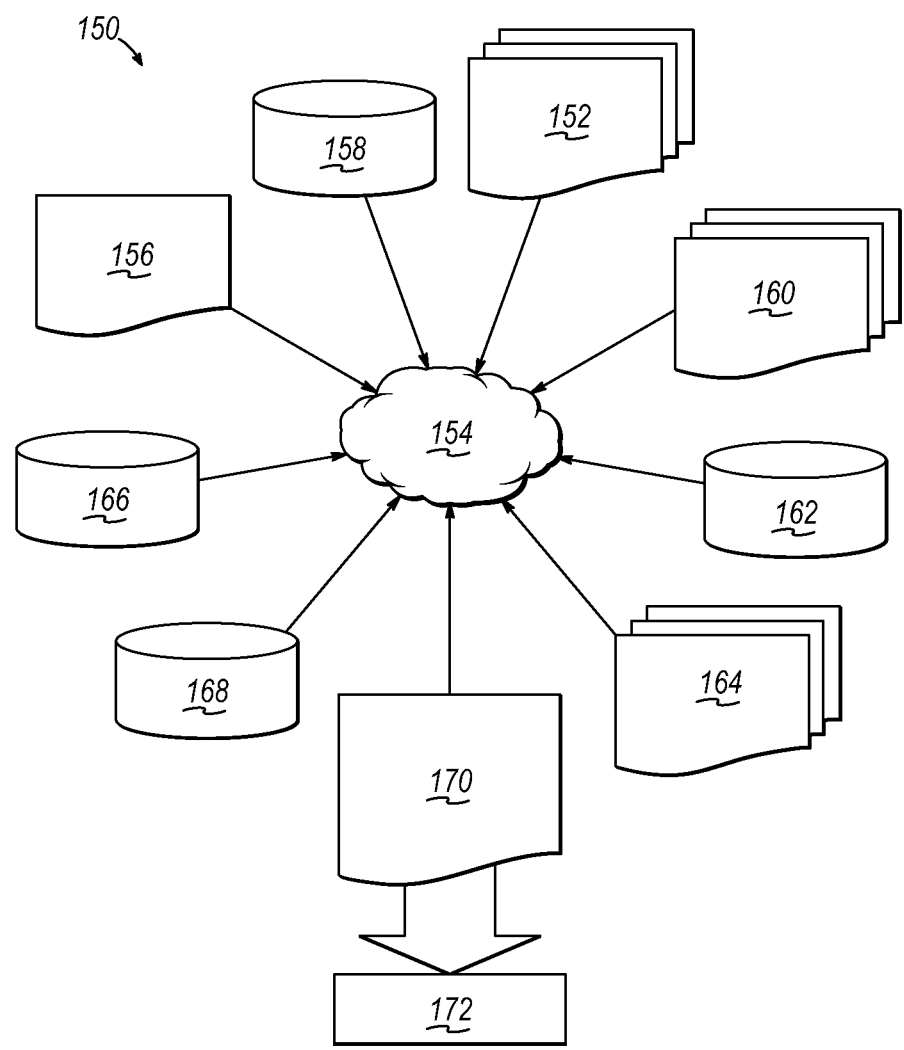
FIG. 16 is a flow diagram of a design process used in semiconductor design, manufacture, and/or test.

FIG. 16 shows a block diagram of an exemplary design flow 150 used for example, in semiconductor IC logic design, simulation, test, layout, and manufacture. Design flow 150 includes processes and mechanisms for processing design structures or devices to generate logically or otherwise functionally equivalent representations of the design structures and/or devices described above and shown in FIGS. 7, 7A, 7B, 12, 12A, 12B, 13, 14, 15. The design structures processed and/or generated by design flow 150 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Design flow 150 may vary depending on the type of representation being designed. For example, a design flow 150 for building an application specific IC (ASIC) may differ from a design flow 150 for designing a standard component or from a design flow 150 for instantiating the design into a programmable array, for example a programmable gate array (PGA) or a field programmable gate array (FPGA) offered by Altera® Inc. or Xilinx® Inc.

FIG. 16 illustrates multiple such design structures including an input design structure 152 that is preferably processed by a design process 154. Design structure 152 may be a logical simulation design structure generated and processed by design process 154 to produce a logically equivalent functional representation of a hardware device. Design structure 152 may also or alternatively comprise data and/or program instructions that when processed by design process 154, generate a functional representation of the physical structure of a hardware device. Whether representing functional and/or structural design features, design structure 152 may be generated using electronic computer-aided design (ECAD) such as implemented by a core developer/designer. When encoded on a machine-readable data transmission, gate array, or storage medium, design structure 152 may be accessed and processed by one or more hardware and/or software modules within design process 154 to simulate or otherwise functionally represent an electronic component, circuit, electronic or logic module, apparatus, device, or system such as those shown in FIGS. 7, 7A, 7B, 12, 12A, 12B, 13, 14, 15. As such, design structure 152 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher-level design languages such as C or C++.

Design process 154 preferably employs and incorporates hardware and/or software modules for synthesizing, translating, or otherwise processing a design/simulation functional equivalent of the components, circuits, devices, or logic structures shown in FIGS. 7, 7A, 7B, 12, 12A, 12B, 13, 14, 15 to generate a netlist 156 which may contain design structures such as design structure 152. Netlist 156 may comprise, for example, compiled or otherwise processed data structures representing a list of wires, discrete components, logic gates, control circuits, I/O devices, models, etc. that describes the connections to other elements and circuits in an integrated circuit design. Netlist 156 may be synthesized using an iterative process in which netlist 156 is resynthesized one or more times depending on design specifications and parameters for the device. As with other design structure types described herein, netlist 156 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 154 may include hardware and software modules for processing a variety of input data structure types including netlist 156. Such data structure types may reside, for example, within library elements 158 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 160, characterization data 162, verification data 164, design rules 166, and test data files 168 which may include input test patterns, output test results, and other testing information. Design process 154 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 154 without deviating from the scope and spirit of the invention. Design process 154 may also include modules for performing standard circuit design processes such as timing analysis, verification, design rule checking, place and route operations, etc.

Design process 154 employs and incorporates logic and physical design tools such as HDL compilers and simulation model build tools to process design structure 152 together with some or all of the depicted supporting data structures along with any additional mechanical design or data (if applicable), to generate a second design structure 170. Design structure 170 resides on a storage medium or programmable gate array in a data format used for the exchange of data of mechanical devices and structures (e.g., information stored in an IGES, DXF, Parasolid XT, JT, DRG, or any other suitable format for storing or rendering such mechanical design structures). Similar to design structure 152, design structure 170 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 7, 7A, 7B, 12, 12A, 12B, 13, 14, 15. In one embodiment, design structure 170 may comprise a compiled, executable HDL simulation model that functionally simulates the devices shown in FIGS. 7, 7A, 7B, 12, 12A, 12B, 13, 14, 15.

Design structure 170 may also employ a data format used for the exchange of layout data of integrated circuits and/or symbolic data format (e.g. information stored in a GDSII (GDS2), GL1, OASIS, map files, or any other suitable format for storing such design data structures). Design structure 170 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 7, 7A, 7B, 12, 12A, 12B, 13, 14, 15. Design structure 170 may then proceed to a stage 172 where, for example, design structure 170: proceeds to tape-out, is released to manufacturing, is released to a mask house, is sent to another design house, is sent back to the customer, etc.

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The term "vertical" refers to a direction perpendicular to the horizontal, as just defined. Terms, such as "on", "above", "below", "side" (as in "sidewall"), "upper", "lower", "over", "beneath", and "under", are defined with respect to the horizontal plane. It is understood that various other frames of reference may be employed for describing the invention without departing from the spirit and scope of the invention. It is also understood that features of the invention are not necessarily shown to scale in the drawings. Furthermore, to the extent that the terms "composed of", "includes", "having", "has", "with", or variants thereof are used in either the detailed description or the claims, such terms are intended to be inclusive in a manner similar to the term "comprising."

It will be understood that when an element as a layer, region or substrate is described as being "on" or "over" another element, it can be directly on or over the other element or intervening elements may also be present. In contrast, when an element is described as being "directly on" or "directly over" another element, there are no intervening elements present. It will also be understood that when an element is described as being "attached", "connected", or "coupled" to another element, it can be directly connected or coupled to the other element or intervening elements may be present. In contrast, when an element is described as being "directly attached", "directly connected", or "directly coupled" to another element, there are no intervening elements present.

The fabrication of the structures herein has been described by a specific order of fabrication stages and steps. However, it is understood that the order may differ from that described. For example, the order of two or more fabrication steps may be swapped relative to the order shown. Moreover, two or more fabrication steps may be conducted either concurrently or with partial concurrence. In addition, various fabrication steps may be omitted and other fabrication steps may be added. It is understood that all such variations are within the scope of the present invention. It is also understood that features of the present invention are not necessarily shown to scale in the drawings.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A back-end-of-line (BEOL) interconnect structure comprising:
    a first metallization level including a first dielectric layer with a top surface and a first conductive feature in the dielectric layer, the first conductive feature having a top surface that projects above at least a portion of the top surface of the first dielectric layer;
    a passive element on the top surface of the first dielectric layer, the passive element including a layer of a conductive material having a top surface that is approximately coplanar with the top surface of the first conductive feature or below the top surface of the first conductive feature; and
    a second metallization level including a second conductive feature having a bottom surface coupled with the top surface of the layer of the passive element, the bottom surface of the second conductive feature positioned above the top surface of the first conductive feature.

2. The BEOL interconnect structure of claim 1 further comprising:
    a third conductive feature in the first dielectric layer, the third conductive feature having a top surface that projects above the portion of the top surface of the first dielectric layer, and the passive element is located between the first and third conductive features.

3. The BEOL interconnect structure of claim 2 wherein a recess is defined in the first dielectric layer between the first and third conductive features, and the passive element is positioned within the recess laterally between the first and third conductive features.

4. The BEOL interconnect structure of claim 3 wherein the layer of the conductive material has a width that is less than a width of the recess.

5. The BEOL interconnect structure of claim 4 wherein the top surface of the layer of the conductive material is located below the top surface of the first conductive feature.

6. The BEOL interconnect structure of claim 1 wherein the passive element is a thin film resistor, and the layer of the conductive material is a body of the thin film resistor.

7. The BEOL interconnect structure of claim 6 wherein the body has a bottom surface that is in a directly contacting relationship with the first dielectric layer.

8. The BEOL interconnect structure of claim 1 wherein the top surface of the layer of the conductive material is located below the top surface of the first conductive feature.

9. The BEOL interconnect structure of claim 1 wherein the passive element is a metal-insulator-metal capacitor that includes a first conductive plate defining the layer of the conductive material, a second conductive plate, and an interplate dielectric layer between the first and second conductive plates.

10. The BEOL interconnect structure of claim 9 wherein the second conductive plate has a bottom surface that is in a directly contacting relationship with the first dielectric layer.

11. The BEOL interconnect structure of claim 1 wherein the second metallization level includes a second dielectric layer, a first trench in the second dielectric layer, a first via in the second dielectric layer that extends from the first trench to the top surface of the layer of the passive element, and a first stud in the via, the second conductive feature is located in the first trench and has a bottom surface coupled by the first stud with the top surface of the conductive layer of the passive element.

12. The BEOL interconnect structure of claim 11 wherein the top surface of the layer of the conductive material is located below the top surface of the first conductive feature, the second metallization level includes a third conductive feature, a second trench in the second dielectric layer, a second via in the second dielectric layer that extends from the second trench to the top surface of the layer of the passive element, and a second stud in the via, the third conductive feature is located in the second trench and has a bottom surface coupled by the second stud with the top surface of the first conductive feature, and the first via and the first stud are taller than the second via and the second stud.

* * * * *